United States Patent [19]

Knapp

[11] 4,395,437
[45] Jul. 26, 1983

[54] METHOD OF FORMING A SECONDARY EMISSIVE COATING ON A DYNODE

[75] Inventor: Alan G. Knapp, Crawley, England

[73] Assignee: U.S. Philips Corporation, New York, N.Y.

[21] Appl. No.: 286,906

[22] Filed: Jul. 27, 1981

Related U.S. Application Data

[63] Continuation of Ser. No. 135,965, Mar. 31, 1980, abandoned.

[30] Foreign Application Priority Data

Apr. 2, 1979 [GB] United Kingdom ............... 7911400
Mar. 13, 1980 [GB] United Kingdom ............... 8008511

[51] Int. Cl.$^3$ ............................................. B05D 5/12
[52] U.S. Cl. ................................. 427/78; 427/126.3; 427/126.4; 427/250; 427/255.2; 427/255.7; 427/350; 427/377; 427/383.3; 427/405; 427/419.2
[58] Field of Search .................... 427/78, 126.3, 126.4, 427/405, 419.2, 250, 255.2, 255.7, 295, 350, 377, 383.1, 383.3; 313/96, 103 CM, 105 CM, 355, 399

[56] References Cited

U.S. PATENT DOCUMENTS

2,548,514 4/1951 Bramley ................................. 427/78
3,836,393 9/1974 Ernsthausen et al. ................. 427/78
3,976,905 8/1976 Seidman et al. ............. 313/105 CM
4,088,510 5/1978 Dresner et al. ........................ 427/78
4,099,079 7/1978 Knapp ........................ 313/103 CM

FOREIGN PATENT DOCUMENTS

1330600 9/1973 United Kingdom .
1401969 8/1975 United Kingdom .
1402549 8/1975 United Kingdom .
1434053 4/1976 United Kingdom .
1523730 9/1978 United Kingdom .

*Primary Examiner*—Michael R. Lusignan
*Assistant Examiner*—Richard Bueker
*Attorney, Agent, or Firm*—Marc D. Schechter

[57] ABSTRACT

A method of forming an emissive coating on a dynode substrate. The method comprises the steps of vapor depositing a composite coating consisting of magnesium and aluminum onto the dynode substrate. A 50 to 500 angstrom thick layer of aluminum is vapor deposited over the composite coating and the aluminum layer is oxidized. The coated dynode is then activated by heating it in an oxygen atmosphere at a pressure of at least $5 \times 10^{-6}$ Torr oxygen at a temperature between 270° and 400° C. The resulting secondary emissive coating contains from 1.5 to 90% by weight of magnesium. The coated dynodes are used in channel electron multipliers which are suitable for use in electron display tubes such as image intensifiers or color television display tubes.

13 Claims, 4 Drawing Figures

METHOD OF FORMING A SECONDARY EMISSIVE COATING ON A DYNODE

This is a continuation of application Ser. No. 135,965, filed Mar. 31, 1980, now abandoned.

BACKGROUND OF THE INVENTION

The present invention relates to a method of forming a secondary emissive coating on a dynode, to a dynode coated by such a method, to a channel electron multiplier comprising a stack of such dynodes, and to an electron display tube, for example a cathode-ray tube or an image intensifier, including such a channel electron multiplier.

United Kingdom patent specifications Nos. 1,401,969, 1,402,549 and 1,434,053 describe different types of channel electron multipliers, each of which consist essentially of a stack of perforate, metal, electrically conductive layers. Each layer has a regular array of apertures with the apertures of each layer aligned with those of the other conductive layers in the stack so as to define the channels. Separators are disposed between each pair of adjacent conductive layers. The separators do not obstruct the channels. When the material making up the conductive layers is not sufficiently secondary emissive for a particular application, the secondary emissive properties of the conductive layers can be enhanced by providing a coating of a more emissive material at least on the exposed surfaces of the conductive layers inside the channels. This may be done on all of the conductive layers, but it may be preferable to apply the emissive coating only to the first few conductive layers located on the input side of the channel electron multiplier.

United Kingdom specification No. 1,523,730 describes dynodes suitable for use in channel electron multipliers. These dynodes consist of substrates bearing secondary emissive coatings of cermets of specified compositions, each containing an alkali metal fluoride. However, the secondary emissive coefficients of these cermets are not appreciably more than 4.

An article entitled "Growth of MgO Films With High Secondary Electron Emission on Al-Mg Alloys" by B. Goldstein and J. Dresner (Surface Science, Volume 71 Number 1, 1978, pages 15-26) discloses the formation of secondary emissive layers by the oxidation and activation of high purity sheet Al-Mg alloys having Mg-contents of from 0.1 to 3% by weight. The magnesium concentration in the surface oxide layers was increased by heating oxidized alloy sheets at temperatures on the order of 450° C. Secondary emission coefficients ($\delta$) of from 10 to 15 were obtained by this method. These alloys are not suitable for making dynodes for channel electron multipliers since an etching technique is not at present available for etching these alloys in the geometries desired for dynodes.

During the investigations which led to the present invention, it was found that secondary emissive coatings formed by evaporating aluminum-magnesium alloys containing from 0.1 to 3% by weight of magnesium could not be activated readily.

SUMMARY OF THE INVENTION

The present invention provides a method of forming a secondary emissive coating on a dynode. The method comprises the steps of vapor depositing a composite coating at least 200 Å thick consisting of magnesium and aluminum onto the dynode, and then vapor depositing from 50 to 500 Å of aluminum over the composite coating. The exposed aluminum layer is oxidized, and then the coated dynode is activated by heating it in an oxygen atmosphere at a pressure of at least $5 \times 10^{-6}$ Torr at a temperature of between 270° and 400° C. According to the invention, the secondary emissive coating contains from 1.5 to 90% by weight of magnesium. Activation may be performed in an oxygen atmosphere at a pressure from $5 \times 10^{-6}$ to $4 \times 10^{-4}$ Torr, particularly when the dynodes are activated in an electron display tube.

The composite coating may consist of a magnesium layer disposed on a subjacent aluminum layer which is disposed on the dynode. The composite coating may be formed by vapor depositing a layer of aluminium onto the dynode, and vapor depositing magnesium and aluminium simultaneously onto the first aluminium layer.

The purpose of depositing an aluminium layer over the magnesium-containing layer is to provide a barrier between the magnesium in this layer and the air. This is necessary because the coated dynode will be exposed to air after it is removed from the vapour deposition atmosphere but before the coating is activated. If the surface skin of the coating contained a significant quantity of magnesium, the magnesium-containing layer would be difficult to oxidize after exposure to air;—this is probably due to the formation of a magnesium hydroxide layer which must be decomposed before a MgO layer can be produced. When the magnesium-containing layer is covered by an aluminum layer, at least the outer thickness of this aluminum layer is converted by oxidation into aluminum oxide. As a result magnesium diffuses into this aluminum oxide layer during the activation step and is oxidized when it reaches the surface of the coating.

Dynodes coated by the method according to the invention are used to make channel electron multipliers which comprise a stack of coated dynodes separated from each other by separating means (separators) disposed between each pair of adjacent dynodes. Each dynode has a regular array of apertures. The apertures of the dynodes are aligned so as to form channels. The separators do not obstruct the channels and are electrically insulating or have a higher electrical resistivity than that of the dynodes. The dynodes consist of single sheets or of two mating sheets which are electrically connected to each other. The dynode material may be coated so as to improve adhesion to the insulating material separating the dynodes, for example glass, and to act as a diffusion barrier to impurities, for example, sulphur, so that the impurities do not poison the emissive coating.

Preferably, the dynodes consist of mild steel, since well-established etching techniques can be used to produce desired dynode geometries in sheet mild steel.

The magnesium and aluminum may be vapor deposited by evaporation, since these metals are easily evaporated. The magnesium-aluminum layer may be, for example from 1000 to 2000 Å thick. When the dynode consists at least substantially of mild steel, an aluminum layer from 100 to 1000 Å thick may be disposed between the mild steel and the magnesium-comprising layer so as to reduce the rate of diffusion of magnesium into the mild steel.

An emissive coating consisting solely of magnesium is more difficult to activate, needing an activation temperature of 300° C., than an emissive coating produced by a method according to the invention. It is possible to activate the coatings formed by the method according to the present invention by heating in an oxygen atmosphere at a pressure from $5 \times 10^{-6}$ to $4 \times 10^{-4}$ Torr for 3 hours at 270° C. This is desirable when dynodes are activated inside an electron-display tube having an envelope with a pressure-bonded seal, such as a lead sealing member. When using higher pressure oxygen atmospheres or activation temperatures above 300° C., it is desirable to activate the dynodes outside an electron display tube in order to avoid gross oxidation of other tube components.

Although this avoids heating other components of the tube in an oxidizing atmosphere, there is then the risk of contaminating the activated secondary emissive surfaces when transferring the activated dynode to the tube.

When the metals used to form the emissive coating are evaporated onto the dynodes, the dynodes may be at room temperature and the pressure in the evaporation chamber is preferably from 1 to $3 \times 10^{-5}$ Torr. The atmosphere in the evaporation chamber consists mainly of water vapor. Although carbon contamination of the dynode surface has the effect of degrading the secondary emission coefficient of the emissive coating if this contamination is not removed, the effect of carbon contamination on the surface of the activated dynode is reduced to a low level since this contamination is reduced during the activation process in 15 minutes from 30% of a monolayer to less than 5% of a monolayer.

It was found that the maximum in the δ-voltage curve for emissive coatings formed by the method according to the invention is at higher voltages (about 600 volts) than was the case for gold-cryolite cermet layers of United Kingdom patent specification No. 1,523,730. This feature may be advantageous with respect to space charge problems on account of the higher currents flowing through the dynodes. The emissive coatings formed by the method according to the invention are more stable to electron bombardment than are the cermets formed with alkali metal fluorides, and there is no risk of fluorine contamination of the electron tube components when using aluminum-magnesium emissive coatings.

DESCRIPTION OF THE PREFERRED EMBODIMENTS

Figure 1:
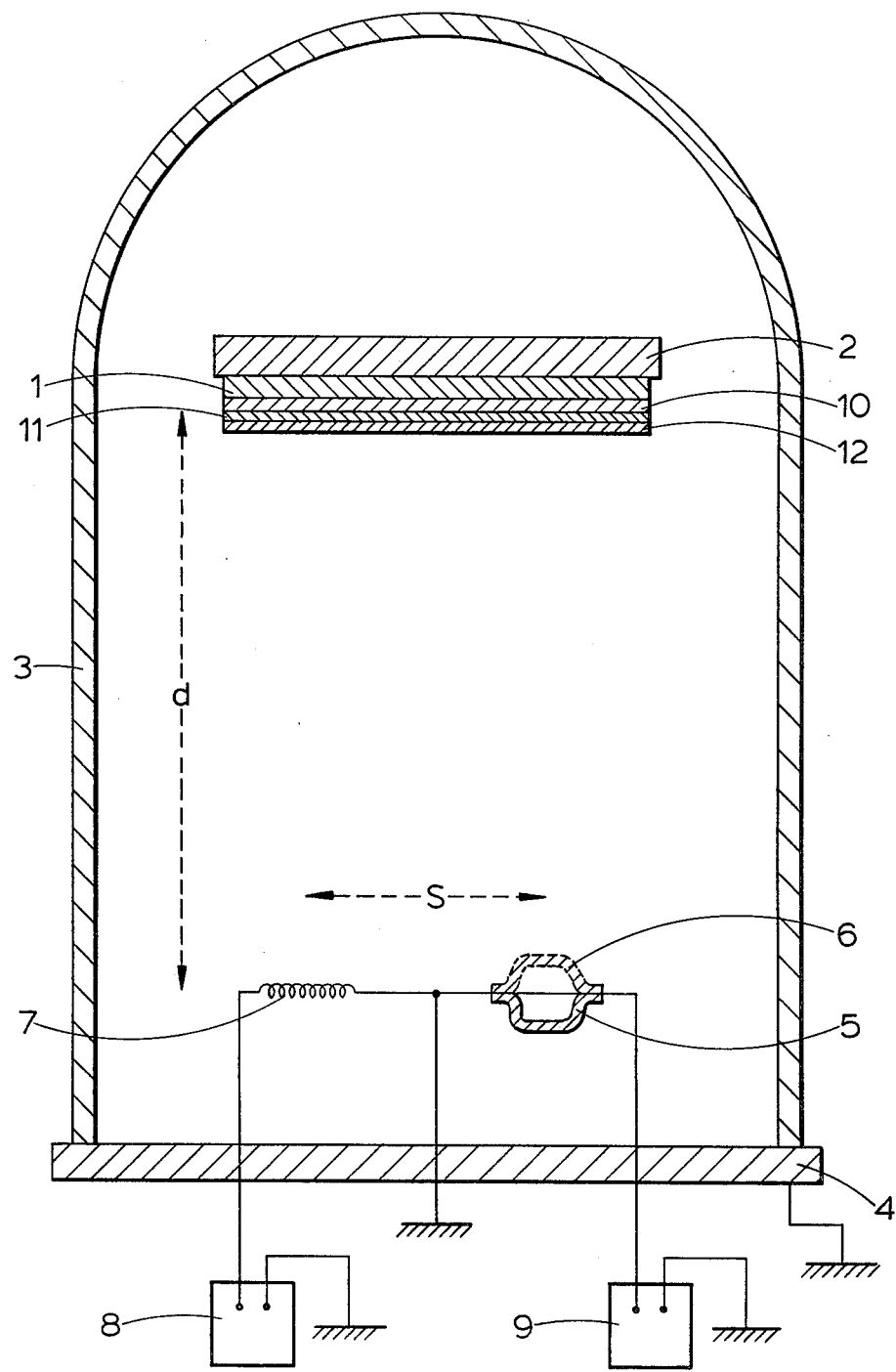
FIG. 1 is a partly schematic, partly cross-sectional view of an apparatus used to evaporate a secondary-emissive coating on a dynode substrate by the method according to the invention.

Referring to FIG. 1, a dynode substrate 1 is mounted on a rotatable work-holder 2 (the means used for rotating the work-holder 2 are not shown for the sake of clarity) inside an evaporation vessel 3 mounted on a pump table 4. The evaporation vessel 3 contains a magnesium source consisting of a molybdenum boat 5 having a perforated cover 6 and containing a charge of magnesium, and an aluminum source which is a tungsten helix 7 which supports pieces of aluminium wire (not shown). The dynode substrate 1 is disposed at a distance d (e.g. 20 cms) above the molybdenum boat 5 and the tungsten helix 7. The distance s between the centers of the molybdenum boat 5 and the tungsten helix 7 is, for example 2 cms. The aluminum and magnesium sources are heated by passing current from respective power supplies 8 and 9 through the helix 7 and through the boat 5, respectively. It appears that provided the ratio d:s is at least 10:1, the composition of a magnesium-aluminum alloy deposited on the dynode substrate 1 by simultaneously evaporating magnesium and aluminum is homogeneous over the area of the dynode substrate 1.

EXAMPLE 1

A mild steel plate 1 which had been plated with 1 μm of nickel was placed on the work-holder 2 in the apparatus described with reference to FIG. 1. The work-holder 2 was rotated at 30 r.p.m. Pressure in the apparatus was reduced to $2 \times 10^{-5}$ Torr, and the aluminum source 7 was energized. A 100 Å thick aluminum layer 10 was formed on the mild steel plates in 2 minutes. Evaporation from the aluminum source 7 was continued and the magnesium source 5 was energized. A 500 Å thick layer 11 consisting of 40% by weight aluminum and 60% by weight magnesium was deposited in 3 minutes. Magnesium deposition was then stopped, and a 75 Å thick layer 12 of pure aluminum was deposited over the magnesium-aluminum layer 11. The coated plate 1 was then left in air at atmospheric pressure at 20° C. for 60 hours so as to convert the surface aluminum layer 12 into aluminum oxide. The coated plate was then activated by heating at 4 hours in a partial pressure of $4 \times 10^{-5}$ Torr oxygen. The secondary emission coefficient (δ) of the activated coating was 5.6 at 500 eV.

EXAMPLE 2

Mild steel plates which had been plated with 1 μm nickel were placed in the apparatus described with reference to FIG. 1. Pressure in the apparatus was reduced to $2 \times 10^{-5}$ Torr, and the aluminum source 7 was energized to deposit a 150 Å thick layer of aluminum on the mild steel plates in 2 minutes. Aluminum deposition was terminated, and 500 Å of magnesium was deposited over the aluminum layer. 200 Å of aluminum was then deposited over the magnesium layer. A first set of the coated plates were oxidized by leaving them in air at atmospheric pressure at 20° C. for 60 hours. A second set of the coated plates were oxidized by heating in air at atmospheric pressure at 100° C. for 1 hour. Both sets of plates were activated by heating for 4 hours in a partial pressure of $4 \times 10^{-5}$ Torr oxygen at 270° C. The secondary emission coefficient (δ) at 500 eV of the first set of plates was 5.85 and was 6.15 for the second set of plates.

EXAMPLE 3

Mild steel plates which had been plated with 1 μm of nickel were coated with a complete aluminum-magnesium-aluminum coating using the method described in Example 2, except that the composite coating consisted of a 300 Å thick layer of aluminum, an 800 Å thick layer of magnesium and a 300 Å thick layer of aluminum. The exposed aluminum surfaces of the coated plates were then oxidized by heating in air at 150° C. for 90 minutes. The oxidized coated plates were then activated in an oxygen atmosphere at atmospheric pressure. The following Table specifies the activation temperatures and periods used, the maximum values ($\delta_{max}$) of the secondary emission coefficients of the activated coatings, and the primary electron energies at which the $\delta_{max}$ values were measured.

TABLE

| Sample | Activation temp. (°C.) | period (hrs) | $\delta_{max}$ | Primary electron energy (eV) |
|---|---|---|---|---|
| a | 350 | 3 | 6.7 | 600 |
| b | 400 | 3 | 8.5 | 700 |
| c | 350 | 4½ | 7.9 | 600 |
| d | 350 | 6½ | 8.3 | 700 |

Channel electron multiplier

Figure 2:
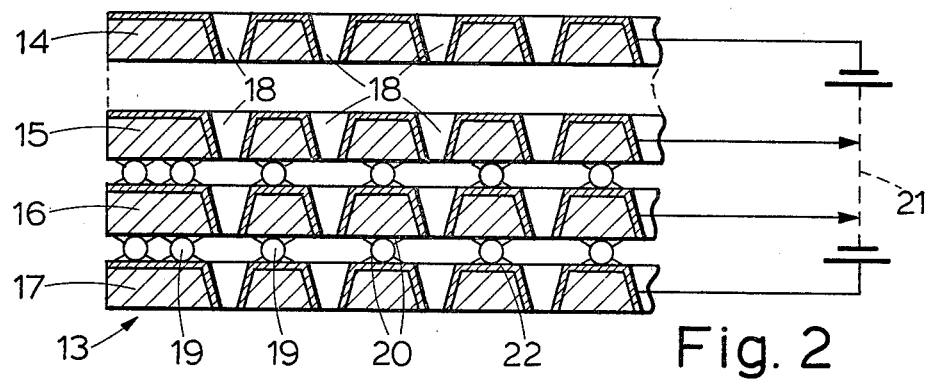
FIG. 2 is a cross-sectional view of part of a channel electron multiplier produced from dynodes coated by the method according to the invention.

FIG. 2 shows part of a channel electron multiplier 13 built up from dynodes 14, 15, 16 and 17. Each of these dynodes comprises a nickel-plated perforated steel plate, the perforations constituting channels 18 each bearing the secondary emissive coating 22 formed by a method according to the present invention. The channels 18 of the dynodes 14, 15, 16, and 17 are aligned with each other and converge in the direction of electron multiplication. The dynodes 14 to 17 are separated by spherical separating elements 19 in the form of ballotini which are bonded by glass enamel 20 to adjacent dynodes. By way of illustration the density of the elements 19 at the imperforate edges of the dynodes 14 to 17 is greater than in the centers thereof. Although the elements 19 are shown positioned between each channel opening of a dynode, they could be spaced apart by integral multiples of the distance between the centers of adjacent channels 18 of a dynode. Each channel 15 bears a secondary emissive coating 22 formed by the method according to the invention.

Figure 3:
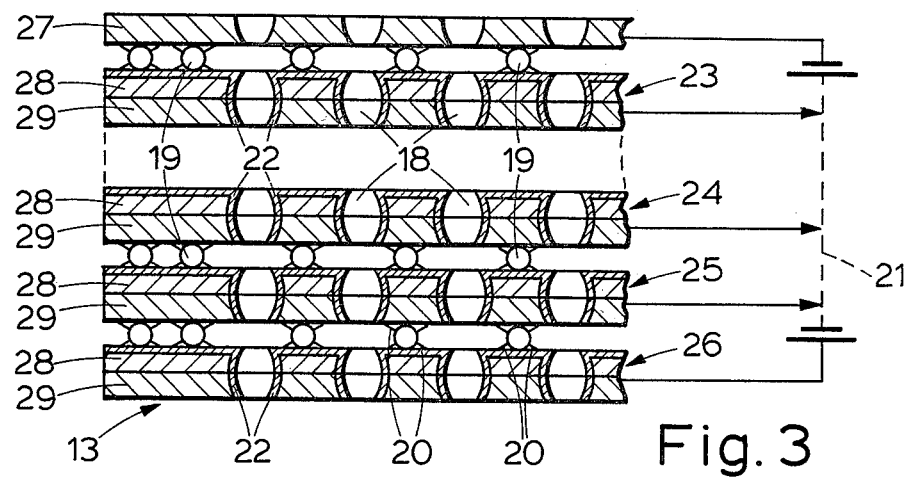
FIG. 3 is a cross-sectional view of part of another channel electron multiplier produced from dynodes coated by the method according to the invention.

As the illustrated separating elements 19 are electrically insulating, it is necessary that each dynode be biased separately by a power supply 21. FIG. 3 shows an alternative embodiment of a channel plate structure 13 to that shown in FIG. 1. Dynodes 23 to 26 each comprise two, juxtaposed, mating perforated metal plates 28 and 29. Each of the channels 18 in the plates 28 and 29 and the top surface of each of the dynodes 23 to 26 bear a secondary emissive coating 22 formed by the method according to the invention. A single perforated metal plate 27 is disposed above the dynodes 23. The separating elements 19 comprise ballotini arranged at suitable intervals between the channels. Once again taps of the power supply 21 are connected to respective dynodes.

Channel plate cathode-ray tube

Figure 4:
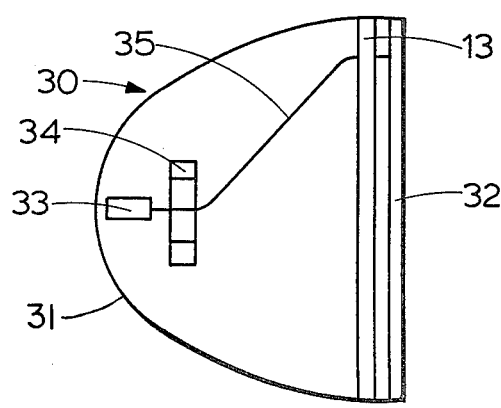
FIG. 4 is a schematic sectional view of a channel plate cathode-ray tube including a channel electron multiplier as shown in FIG. 2 or FIG. 3.

FIG. 4 diagrammatically illustrates a channel plate cathode-ray tube 30 comprising a metal, for example mild steel, cone 31 having a substantially flat plate glass screen 32 closing the open end of the cone 31. A channel electron multiplier 13, as described with reference to FIG. 2, is disposed at a small distance, for example 10 mm, from the screen 32. An electron gun 33 is disposed adjacent the closed end of the cone 31 and a deflection coil assembly 34 is disposed adjacent to, but spaced from, the electron gun 33.

In operation a low energy electron beam 35 from the electron gun 33 is deflected in raster fashion across the input side of the channel electron multiplier structure 13 by the coil assembly 34. The beam undergoes electron multiplication in the channel electron multiplier 13 and the output electrons are applied substantially normally to the screen 32.

What is claimed is:

1. A method of forming a secondary emissive coating on a dynode, the method comprising the steps of vapor depositing a composite coating at least 200 Å thick consisting of magnesium and aluminum onto the dynode, vapor depositing from 50 to 500 Å of aluminum over the composite coating oxidizing the exposed aluminum layer, and activating the coated dynode by heating it in an oxygen atmosphere at a pressure of at least $5 \times 10^{-6}$ Torr oxygen at a temperature between 270° and 400° C., wherein the secondary emissive coating contains from 1.5 to 90% by weight of magnesium.

2. A method as claimed in claim 1, wherein the coated dynode is activated by heating it in an oxygen atmosphere at a pressure of from $5 \times 10^{-6}$ to $4 \times 10^{-4}$ Torr at a temperature between 270° and 400° C.

3. A method as claimed in claim 1 or 2, wherein the composite coating consists of a magnesium layer disposed on a subjacent aluminum layer which abuts the dynode.

4. A method as claimed in claim 1 or 2, wherein the composite coating is formed by vapor depositing a layer of aluminum onto the dynode, and then simultaneously depositing magnesium and aluminum onto this aluminum layer.

5. A method as claimed in claim 4, wherein the dynode consists at least substantially of mild steel, a 100 to 1000 Å thick aluminum layer is vapor deposited onto the dynode, and a coating from 1000 to 2000 Å thick of magnesium and aluminum is vapor deposited onto this aluminum layer.

6. A method of forming a secondary emissive coating on a dynode, said method comprising the steps of:
vapor depositing a composite coating of magnesium and aluminum onto the dynode;
vapor depositing a coating of aluminum over the composite coating;
oxidizing the exposed aluminum layer; and
activating the coated dynode by heating it in an oxygen atmosphere until at least part of the magnesium diffuses through the oxidized aluminum coating and becomes oxidized.

7. A method as claimed in claim 6, characterized in that the composite coating is at least 200 angstroms thick.

8. A method as claimed in claim 7, characterized in that the aluminum coating is at least 50 angstroms thick.

9. A method as claimed in claim 8, characterized in that the aluminum coating is not greater than 500 angstroms thick.

10. A method as claimed in claim 9, characterized in that during the activation step, the oxygen atmosphere has a pressure of at least $5 \times 10^{-6}$ Torr.

11. A method as claimed in claim 10, characterized in that during the activation step, the coated dynode is heated to a temperature greater than or equal to 270° C.

12. A method as claimed in claim 11, characterized in that during the activation step, the coated dynode is heated to a temperature less than or equal to 400° C.

13. A method as claimed in claim 12, characterized in that the composite coating consists of a magnesium layer disposed on a subjacent aluminum layer which abuts the dynode.

* * * * *